United States Patent [19]

Agouridis

[11] 4,394,676

[45] Jul. 19, 1983

[54] PHOTOVOLTAIC RADIATION DETECTOR ELEMENT

[76] Inventor: Dimitrios C. Agouridis, Oak Ridge, Tenn., granted to U.S. Department of Energy under the provisions of 42 U.S.C. 2182

[21] Appl. No.: 217,358

[22] Filed: Dec. 17, 1980

[51] Int. Cl.³ .................. H01L 27/14; H01L 31/00; H01L 29/161
[52] U.S. Cl. .................................. 357/29; 357/30; 357/61
[58] Field of Search ..................... 357/30, 61, 29; 250/370

[56] References Cited

U.S. PATENT DOCUMENTS 4,227,298 10/1980 Keeling et al. .................. 357/30 X
4,243,885 1/1981 Agouridis et al. ............... 357/30 X Primary Examiner—James W. Davie
Assistant Examiner—J. Carroll
Attorney, Agent, or Firm—Edwin D. Grant; Stephen D. Hamel; Richard G. Besha

[57] ABSTRACT

A radiation detector element is formed of a body of semiconductor material, a coating on the body which forms a photovoltaic junction therewith, and a current collector consisting of narrow metallic strips, the aforesaid coating having an opening therein the edge of which closely approaches but is spaced from the current collector strips.

4 Claims, 2 Drawing Figures

PHOTOVOLTAIC RADIATION DETECTOR ELEMENT

BACKGROUND OF THE INVENTION

This invention is a result of a contract with the U.S. Department of Energy. It relates in general to the detection of electromagnetic radiation such as gamma rays or X-rays, and more specifically to an improved element which generates an electric signal when such radiation impinges thereon.

Silicon diodes have long been employed as gamma and X-ray radiation detectors, but their use is limited because electric signals generated therein by radiation of low intensity are masked by noise resulting from their low-junction impedance.

As described in detail in U.S. Pat. No. 4,243,885, and assigned to the U.S. Department of Energy, the assignee of the present invention, the aforesaid noise interference problem can be obviated by use of a radiation detector element formed of cadmium telluride semiconductor material.

PRIOR ART

The aforementioned U.S. patent discloses a radiation dosimeter which employs as its basic detecting element a polycrystalline, chlorine-compensated cadmium telluride wafer having a photovoltaic junction on one of its faces formed by depositing graphite material. The opposite face of the wafer is painted with an electrically conductive material which serves as a current collector. The detector is operated in a photovoltaic mode (zero bias) while DC coupled to a symmetrical differential current amplifier having a very high input impedance, and this amplifier converts the current signal generated by radiation impinging on the wafer to a voltage which operates a voltmeter calibrated to read quantitatively the level of the detected radiation. It is intended that details concerning the structure of the radiation detection device disclosed in the aforementioned U.S. patent are to be incorporated in this application by this reference thereto.

Although the dosimeter structure described in the aforesaid application provides an improved means for detecting low level gamma and X-ray radiation, the arrangement of the current collector of its semiconductor detector wafer, which as stated above covers one face of the wafer, causes a photovoltaic signal at that face which has a magnitude of about 15% of the signal produced by radiation impinging on the opposite, or front, face of the detector element. The two signals have opposite polarity, and since the output signal from the detector element is the algebraic sum of the signals generated at its opposite faces, the output is thus less than the signal generated at the front face of the detector element. This front and back face signal subtraction is disadvantageous; for example, it causes a non-linear response of the detector element to radiation of high energies because high energy radiation generates electrical signals near both faces of the detector.

SUMMARY OF THE INVENTION

It is therefore an object of this invention to provide an improved means for detecting electromagnetic energy such as gamma rays or X-rays.

Another object of the invention is to provide a semiconductor detection device which is sensitive to low level gamma ray or X-ray radiation and which generates an electrical output signal more linearly responsive to different energies of such radiation.

These objects and other advantages are achieved in accordance with a preferred embodiment of the invention by a photovoltaic radiation detector element including (1) a body of polycrystalline chlorine-compensated, cadmium telluride semiconductor material, (2) a current collector on the body of semiconductor material in the form of thin, interconnected strips of silver, which are referred to hereinafter as branch segments of the current collector, and (3) a coating of graphite on the body of semiconductor material which forms therewith an np-type junction, the graphite coating covering the major portion of the body but having therein an opening in which all of the branch segments of the current collector are situated. The opening in the graphite coating conforms with the configuration of the branch segments of the current collector so that its edge is close to the segments. Preferably the collector branch segments radiate from a common point like spokes of a wheel.

DETAILED DESCRIPTION

Figure 1:
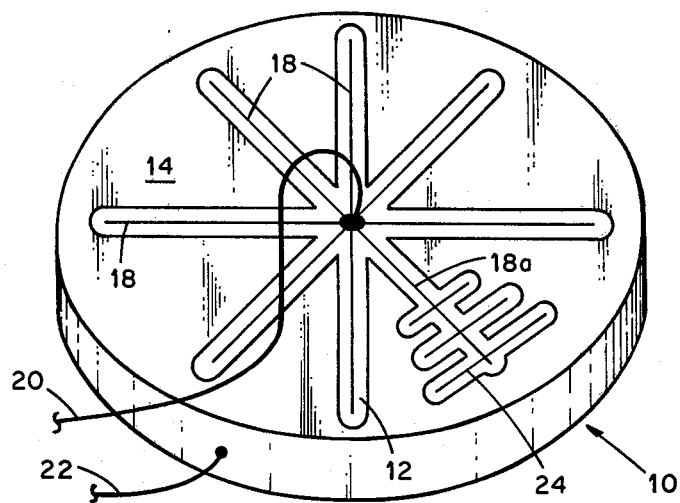
FIG. 1 is a perspective view of a preferred wafer-type detector element constructed in accordance with the invention, with one of its current collector branch segments modified to illustrate an alternate construction thereof.

In FIG. 1, reference number 10 generally designates a radiation detector element comprising a cylindrical wafer 12 of chlorine compensated, polycrystalline cadmium telluride semiconductor material made as described in the aforementioned U.S. patent. The surface of wafer 12 is completely covered by a coating 14 of graphite except at an opening in the coating which is also designated by reference number 12. As described in the aforementioned U.S. patent, the body of chlorine-compensated, cadmium telluride material and the graphite coating 14 form a photovoltaic junction capable of generating an electric current when gamma ray or X-ray radiation impinges thereon.

The edge of the opening 12 in coating 14 closely approaches but is spaced from narrow lines 18 of a conductive material such as silver, which lines are painted or otherwise deposited on the back face (the face shown) of the cadmium telluride wafer 12. Lines 18, referred to hereinafter as branch segments, are connected together at the center of the detecting element and radiate therefrom like spokes of a wheel. Collectively, the branch segments 18 form a means for collecting current generated in the detecting element by gamma or X-ray radiation, and electric leads 20, 22 are respectively connected to this current collector and coating 14 as illustrated, the opposite ends of these leads being connected to a current-to-voltage converter and an associated radiation indicating voltmeter of the type described in the aforementioned U.S. patent.

In a preferred embodiment of the invention, wafer 12 has a diameter of about 1 to 1.6 cm and a thickness of about 2 mm. Branch segments 18 of the current collector are about 1 to 2 mm wide, and the edge of opening 12 in coating 14 is spaced about 1 to 2 mm from the confronting edges of the branch segments. Preferably the branch segments terminate near the edge of wafer 12.

Impingement of gamma ray or X-ray radiation on the front face (i.e., the face of wafer 12 that is lowermost in FIG. 1) of the described detector element generates an electrical signal proportional to the intensity of the radiation. The detected radiation also generates an electric signal at the area of wafer 12 covered by silver branch segments 18, which signal subtracts from the front face signal to provide the effective output of the element. However, because the ratio of the graphite-covered surface to the silver-covered surface is very large, the subtracting signal is negligible. Consequently the response of the detector element is quite constant for radiation of different energies.

Other arrangements that provide a large ratio between the surface of the photovoltaic np-junction and the surface of the current collector branch segments can be provided in accordance with the invention. For example, in FIG. 1 arm segments 24 are disposed normal to one of the branch segments 18a radiating from the center of the back face of the wafer 12, and of course all of the branch segments could be provided with such arm segments. It will be noted that the edge of opening 12 in coating 14 conforms to the shape of the modified branch segment 18a.

Figure 2:
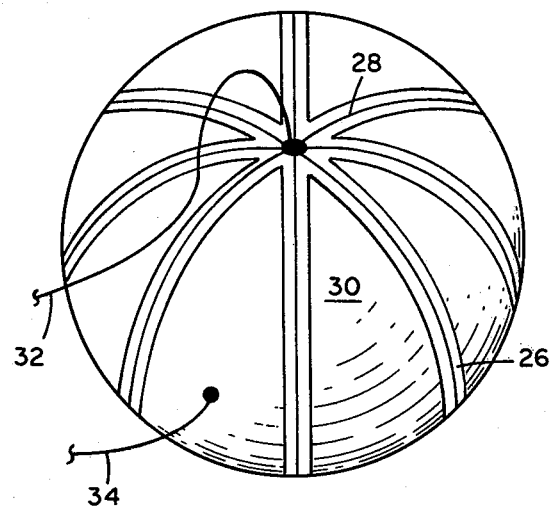
FIG. 2 is a perspective view of another spherical-type embodiment of the invention.

FIG. 2 illustrates another embodiment of the invention comprising a spherical shell 26 formed of chlorine-compensated cadmium telluride semiconductor material, a silver current collector formed with branch segments 28 which radiate from a common point on the shell, and a graphite coating 30 which forms an np-junction with the shell and has an edge which conforms with, and is spaced from, branch segments 28. An electric lead 32 is preferably connected to the center of the current collector and another electric lead 34 is connected to coating 30 as illustrated. The output signal produced by this spherical-type detector element is virtually independent of the direction of impingement of radiation on the surface of the detector element.

What is claimed is:

1. A photovoltaic radiation detector element comprising:
   a body of semiconductor material;
   an electrically conductive current collector attached to said body and formed with a plurality of thin branch segments connected at a common point; and
   a photovoltaic junction forming coating on said body which closely approaches but is spaced from said current collector branch segments.

2. The detector element of claim 1 wherein said body is a wafer and said current collector branch segments radiate from the center of one face thereof.

3. The detector element of claim 2 wherein said current collector includes arm segments disposed normal to branch segments radiating from the center of one face of said wafer.

4. The detector element of claim 2 wherein said wafer is formed of chlorine-compensated cadmium telluride semiconductor material, said coating is formed of graphite, and said current collector is formed of silver.

* * * * *